United States Patent
Wang et al.

(10) Patent No.: US 10,566,446 B2
(45) Date of Patent: Feb. 18, 2020

(54) MITIGATION OF HOT CARRIER DAMAGE IN FIELD-EFFECT TRANSISTORS

(71) Applicant: GLOBALFOUNDRIES Inc., Grand Cayman (KY)

(72) Inventors: Yun-Yu Wang, Poughkeepsie, NY (US); Jochonia Nxumalo, Wappingers Falls, NY (US); Ahmad Katnani, Poughkeepsie, NY (US); Dimitrios Ioannou, White Plains, NY (US); Kenneth Bandy, Red Hook, NY (US); Jeffrey Brown, Hopewell Junction, NY (US); Michael J. MacDonald, Yorktown Heights, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/992,969

(22) Filed: May 30, 2018

(65) Prior Publication Data
US 2019/0371918 A1 Dec. 5, 2019

(51) Int. Cl.
*H01L 29/66* (2006.01)
*H01L 21/8234* (2006.01)
(Continued)

(52) U.S. Cl.
CPC .... *H01L 29/66568* (2013.01); *H01L 21/0217* (2013.01); *H01L 21/02271* (2013.01); *H01L 21/02299* (2013.01); *H01L 21/02348* (2013.01); *H01L 21/223* (2013.01); *H01L 21/823468* (2013.01); *H01L 23/291* (2013.01);
(Continued)

(58) Field of Classification Search
None
See application file for complete search history.

(56) References Cited

U.S. PATENT DOCUMENTS

| 5,229,311 A | 7/1993 | Lai et al. |
| 5,591,681 A * | 1/1997 | Wristers ............... C23C 16/56 257/325 |
| 5,596,218 A | 1/1997 | Soleimani et al. |

(Continued)

OTHER PUBLICATIONS

K. Cheng et al., "Deuterium pressure dependence of characteristics and hot-carrier reliability of CMOS devices", Microelectronic Engineering 56 (2001) 353-358.

*Primary Examiner* — Andres Munoz
(74) *Attorney, Agent, or Firm* — Thompson Hine LLP

(57) ABSTRACT

Methods of improving hot carrier parameters in a field-effect transistor by hydrogen reduction. A gate structure of the field-effect transistor is formed on a substrate, and the substrate is heated inside a deposition chamber to a given process temperature for a given time period. After the time period concludes, a conformal layer is deposited at the given process temperature over the gate structure, and is subsequently etched to form sidewall spacers on the gate structure. After the sidewall spacers are formed, a capping layer is conformally deposited over the gate structure and the sidewall spacers, and cured with an ultraviolet light treatment. An interconnect structure may be formed over the field-effect transistor and the capping layer, and a moisture barrier layer may be formed over the interconnect structure. The moisture barrier layer is composed of a material that is permeable to hydrogen and impermeable to water molecules.

16 Claims, 4 Drawing Sheets

(51) Int. Cl.
*H01L 21/02* (2006.01)
*H01L 29/78* (2006.01)
*H01L 23/29* (2006.01)
*H01L 29/40* (2006.01)
*H01L 21/223* (2006.01)

(52) U.S. Cl.
CPC ........ H01L 29/401 (2013.01); H01L 29/7833 (2013.01); H01L 29/7843 (2013.01)

(56) References Cited

U.S. PATENT DOCUMENTS

| | | | |
|---|---|---|---|
| 5,872,387 A | 2/1999 | Lyding et al. | |
| 6,017,806 A | 1/2000 | Harvey | |
| 6,147,014 A | 11/2000 | Lyding et al. | |
| 6,268,269 B1 | 7/2001 | Lee et al. | |
| 6,461,979 B1* | 10/2002 | Lin | C23C 16/46 438/763 |
| 6,797,644 B2 | 9/2004 | Watt et al. | |
| 8,673,728 B2* | 3/2014 | Flachowsky | H01L 28/20 438/382 |
| 9,018,106 B1* | 4/2015 | Koehler | H01L 21/76224 438/778 |
| 2005/0026434 A1* | 2/2005 | Huy | C23C 16/345 438/689 |
| 2006/0009041 A1* | 1/2006 | Iyer | H01L 21/324 438/724 |
| 2009/0242999 A1* | 10/2009 | Koehler | H01L 21/28176 257/410 |
| 2009/0246371 A1* | 10/2009 | Koehler | H01L 21/0223 427/248.1 |
| 2010/0009548 A1* | 1/2010 | Nakamura | H01L 21/3225 438/795 |
| 2010/0320512 A1* | 12/2010 | Idaka | H01L 21/3105 257/288 |
| 2012/0228684 A1* | 9/2012 | Nagai | H01L 21/76834 257/295 |

* cited by examiner

MITIGATION OF HOT CARRIER DAMAGE IN FIELD-EFFECT TRANSISTORS

BACKGROUND

The present invention relates to semiconductor device fabrication and integrated circuits and, more specifically, to methods of improving hot carrier parameters in a field-effect transistor by hydrogen reduction.

Complementary-metal-oxide-semiconductor (CMOS) processes may be used to build a combination of p-type field-effect transistors (pFETs) and n-type field-effect transistors (nFETs) that are coupled to implement logic gates and other types of integrated circuits, such as switches. Field-effect transistors may include a source, a drain, a channel region between the source and the drain, a gate electrode, and a gate oxide arranged between the gate electrode and the channel region. When a control voltage exceeding a designated threshold voltage is applied to the gate electrode, a device output current is produced by carrier flow in the channel region between the source and drain.

Arsenic may be implanted as an n-type dopant to form source and drain extensions. As shown in FIG. 1A, the junctions with the channel region on both the source side and the drain side are abrupt in this circumstance. Alternatively, arsenic and phosphorus may be co-implanted as n-type dopants to form source and drain extensions. As shown in FIG. 1B, the junctions with the channel region are broadened on both the source side and the drain side due to the inward diffusion of phosphorus.

Device reliability is an ongoing issue for semiconductor manufacturing and development. One of the detractors for reliability is attributed to hot carrier effects. In particular, the effects of hot carrier stress may degrade the performance of a field-effect transistor over time by damaging the drain side of the channel and the gate oxide. During hot carrier stress testing of a field-effect transistor to simulate actual device operation, a constant voltage is applied to the drain and the gate. As shown in FIG. 1C, hot carriers moving from the source to the drain may cause hydrogen release from the gate oxide at the drain side of the channel by breaking hydrogen-oxygen bonds. The released hydrogen may prompt the passivation or deactivation of phosphorus on the drain side of the channel by, for example, attracting electrons from the dopant or by forming bonds with the dopant. Because of the hydrogen passivation, hot electron stress causes the junction at the drain side to become abrupt, whereas the junction on the source side remains broad. Due at least in part to development of this asymmetry, the device drive current may degrade over time.

Improved methods of improving hot carrier parameters in a field-effect transistor by hydrogen reduction are needed.

SUMMARY

In an embodiment of the invention, a method includes forming a gate structure of a field-effect transistor on a substrate, and heating the substrate inside a deposition chamber to a given process temperature for a time period of greater than or equal to 100 seconds. After the time period concludes, a conformal layer is deposited at the given process temperature over the gate structure. The method further includes etching the conformal layer to form a plurality of sidewall spacers on the gate structure. After the sidewall spacers are formed, a capping layer is conformally deposited over the gate structure and the sidewall spacers, and then cured with an ultraviolet light treatment.

In an embodiment of the invention, a method includes forming a gate structure of a field-effect transistor on a substrate, and heating the substrate inside a deposition chamber to a given process temperature for a time period of greater than or equal to 100 seconds. After the time period concludes, a conformal layer is deposited at the given process temperature over the gate structure. The method further includes etching the conformal layer to form a plurality of sidewall spacers on the gate structure, forming an interconnect structure over the field-effect transistor, and forming a moisture barrier layer over the interconnect structure. The moisture barrier layer is composed of a material that is permeable to hydrogen and that is impermeable to water molecules.

In an embodiment of the invention, a method includes forming a gate structure of a field-effect transistor on a substrate, and forming sidewall spacers on the gate structure. After the sidewall spacers are formed, a capping layer is conformally deposited over the gate structure and the sidewall spacers, and cured with an ultraviolet light treatment. The method further includes forming an interconnect structure over the field-effect transistor, and forming a moisture barrier layer over the interconnect structure. The moisture barrier layer is composed of a material that is permeable to hydrogen and that is impermeable to water molecules.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1A:
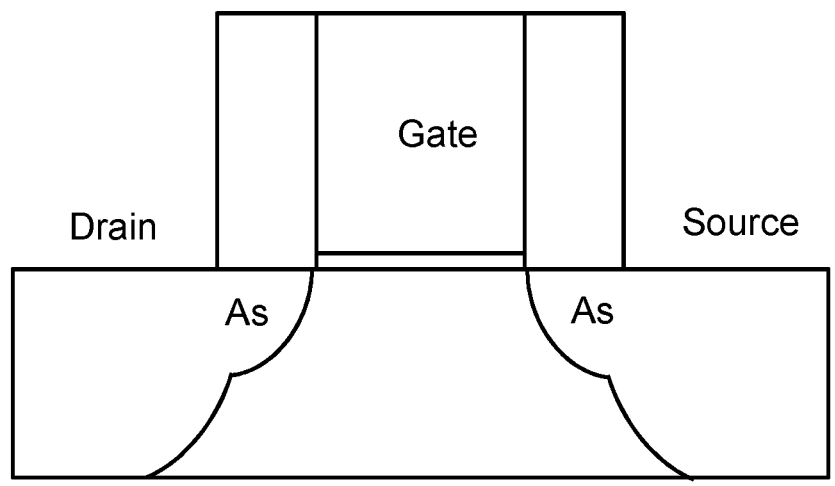
FIGS. 1A-1C are diagrammatic views of field-effect transistors in accordance with the prior art.
Figure 1B:
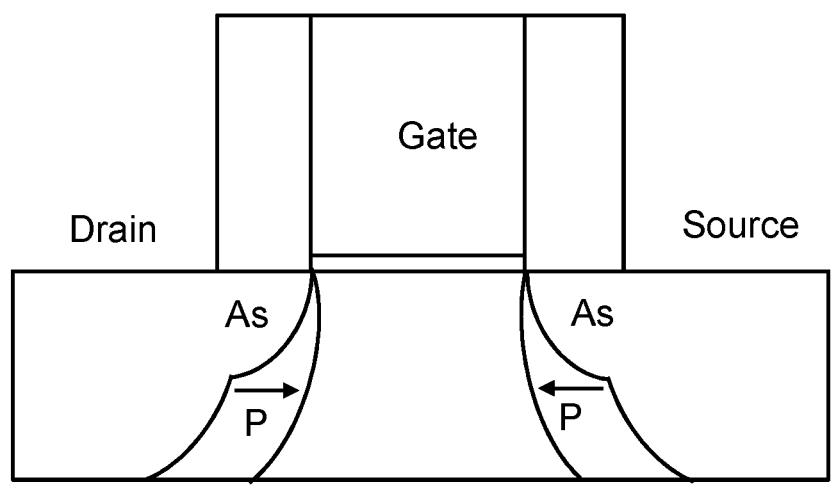
Figure 1C:
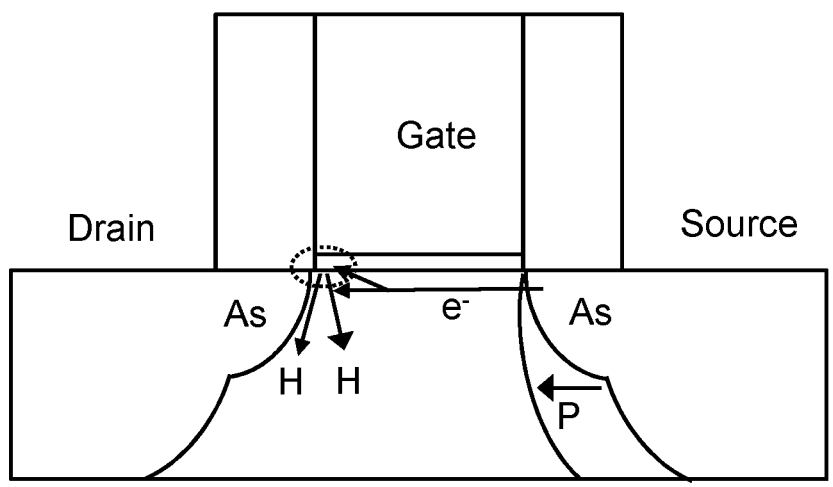
Figure 2:
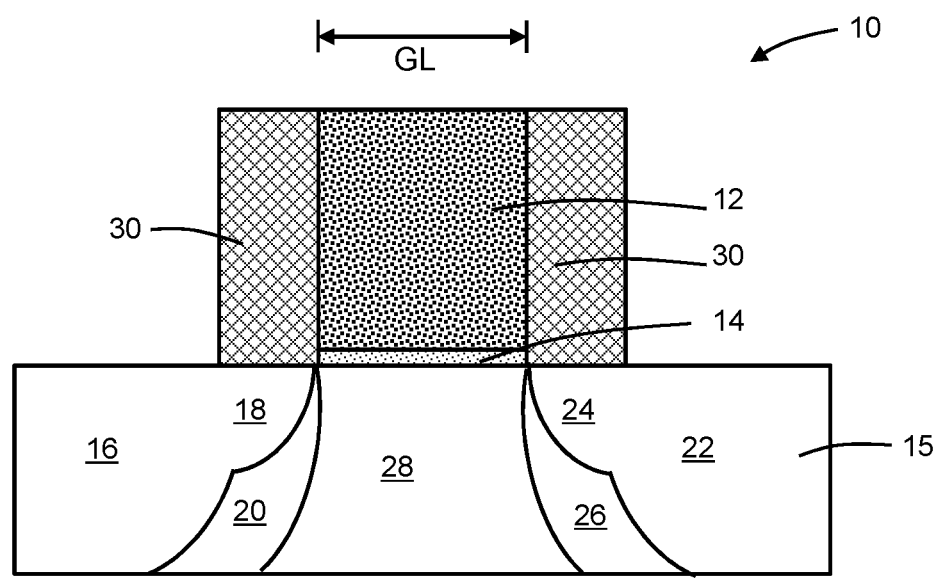
FIGS. 2-4 are cross-sectional views of a structure for a field-effect transistor at successive fabrication stages of a processing method in accordance with embodiments of the invention.

With reference to FIG. 2 and in accordance with embodiments of the invention, a device structure, generally indicated by reference numeral 10, may be formed by front-end-of-line (FEOL) processing using a device region of a semiconductor substrate. The device structure 10 may include a field-effect transistor that includes a gate structure having a gate electrode 12 and a gate dielectric 14 arranged between the gate electrode 12 and a substrate 15. The gate electrode 12 may be composed of a conductor, such as doped polycrystalline silicon (i.e., polysilicon), and the gate dielectric 14 may be composed of an electrical insulator, such as silicon dioxide ($SiO_2$). The gate electrode 12 and the gate dielectric 14 formed by depositing a layer stack of their respective materials and patterning the layer stack with photolithography and etching.

The device structure 10 includes a drain 16, a source 22, doped lateral extension regions 18, 24, and doped lateral extension regions 20, 26 that are arranged in the substrate 15, as well as a channel region 28 of the device structure 10 that is arranged beneath the gate electrode 12 and between the drain 16 and source 22. In an embodiment, the drain 16, source 22, doped lateral extension regions 18, 24, and doped lateral extension regions 20, 26 may contain a concentration of an n-type dopant from Group V of the Periodic Table (e.g., phosphorus (P) and/or arsenic (As)) that provides n-type electrical conductivity, and the channel region 28 may have the opposite p-type electrical conductivity. For example, the doped lateral extension regions 18, 24 may be doped by co-implantation with arsenic and phosphorus, the doped lateral extension regions 20, 26 may contain phosphorous diffused out of the doped lateral extension regions 18, 24, and the drain 16 and source 22 may be implanted with phosphorus or arsenic.

Sidewall spacers 30 are arranged at the sidewalls of the gate structure. The sidewall spacers 30 may be composed of a dielectric material, such as silicon nitride (SiN), deposited as a conformal layer by rapid thermal chemical vapor deposition (RTCVD) and etched with a directional etching process, such as reactive ion etching (ME). The conformal layer of dielectric material may be deposited under conditions during RTCVD that reduce its hydrogen content and, thereby, the hydrogen content of the sidewall spacers 30. Specifically, the substrate 15 may be inserted at room temperature into a deposition chamber, heated by, for example, heat lamps inside the deposition chamber of the RTCVD system to ramp the substrate 15 from room temperature to a predetermined process temperature, and held at the predetermined process temperature for a given hold time period before the deposition process is initiated. At the conclusion of the hold time period, the deposition is performed at the predetermined process temperature to deposit the conformal layer. In an embodiment, the predetermined process temperature may be 750° C. In an embodiment, the predetermined process temperature is held constant during the hold time period and is held constant during the deposition of the conformal layer. In an embodiment, the hold time period may be greater than or equal to 100 seconds, which is longer than conventional hold times of less than 50 seconds and which provides a lengthier time period for hydrogen to escape from the device structure 10 by thermally-induced diffusion before deposition of the conformal layer. In an embodiment, the hold time period may be within a range from 100 seconds to 300 seconds. The released hydrogen is evacuated by vacuum pumps out of the deposition chamber. The result is that the sidewall spacers 30 in the final device structure 10 are characterized by a lower hydrogen content than conventional sidewall spacers, and the reduction in the hydrogen content of the sidewall spacers 30 may reduce dopant deactivation at the drain side (i.e., the doped lateral extension region 20 at the drain side) by hot carrier effects in an operating device structure.

Figure 3:
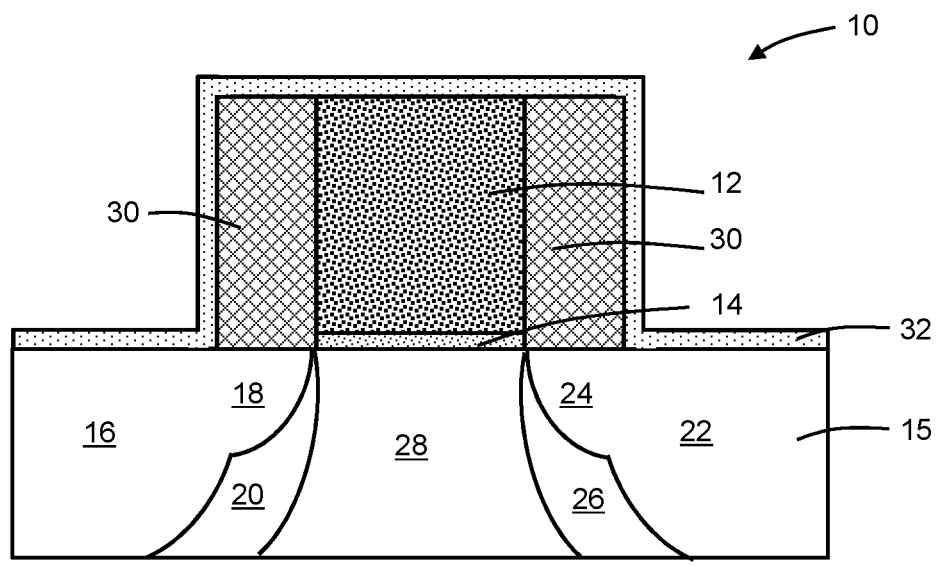

With reference to FIG. 3 in which like reference numerals refer to like features in FIG. 2 and at a subsequent fabrication stage of the processing method, a capping layer 32 is formed that extends over the device structure 10 and is composed of a dielectric material and, in an embodiment, a dielectric material that incorporates internal stress. The internal stress incorporated into the material of the capping layer 32 may be compressive stress. Alternatively, the internal stress incorporated into the material of the capping layer 32 may be tensile stress. The internal stress is transferred from the capping layer 32 into the underlying device structure 10 and may be effective to alter carrier mobility. In an embodiment, the capping layer 32 may be composed of a dielectric material, such as silicon nitride (SiN), that is deposited by chemical vapor deposition (CVD) under deposition conditions that provide either compressive stress or tensile stress.

The silicon nitride of the capping layer 32 may be deposited using a source gas that contains hydrogen, such as a combination of ammonia ($NH_3$) and silane ($SiH_4$). In an embodiment, the capping layer 32 may be cured using ultraviolet light that promotes the release of hydrogen that is incorporated during deposition from the source gas into the capping layer 32. In an embodiment, multiple sequences of deposition and ultraviolet curing may be used to build the capping layer 32 from multiple individual deposited and cured layers. The ultraviolet light breaks hydrogen bonds to generate free hydrogen that is released from the capping layer 32 to the ambient environment of the deposition chamber and is evacuated from the deposition chamber. The result is that the capping layer 32 in the completed device structure 10 includes a lower concentration of hydrogen than in the absence of the ultraviolet light curing, and the reduction in the hydrogen concentration in the capping layer 32 may reduce dopant deactivation at the drain side (i.e., the doped lateral extension region 20 at the drain side) by hot carrier effects in an operating device structure.

In an embodiment, the device structure 10 may be a long channel device in which the gate length, GL, is between 120 nanometers and 300 nanometers. In such a long channel device, the presence or absence of internal tensile or compressive stress in the capping layer 32 to alter carrier mobility is immaterial. Consequently, the use of ultraviolet curing in order to modulate the hydrogen content of the capping layer 32 applied to a long channel device is an unconventional use.

Figure 4:
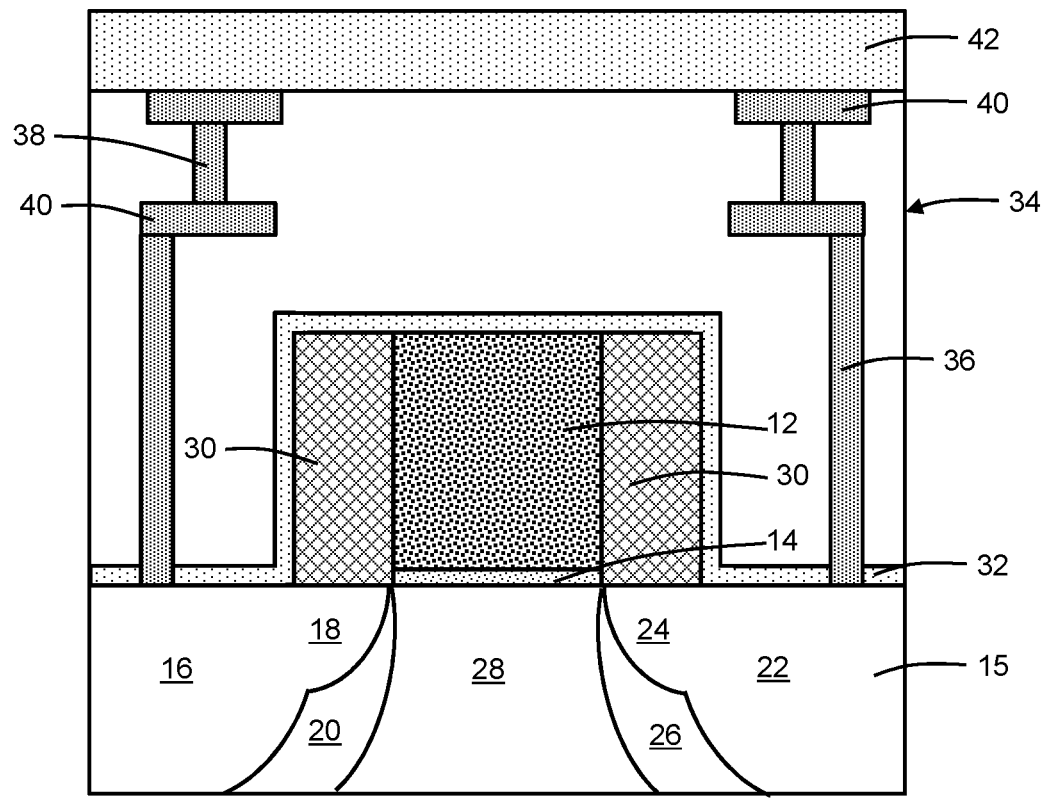

With reference to FIG. 4 in which like reference numerals refer to like features in FIG. 3 and at a subsequent fabrication stage of the processing method, an interconnect structure, generally indicated by reference numeral 34, is formed by middle-of-line (MOL) processing and back-end-of-line (BEOL) processing. The interconnect structure 34 includes dielectric layers, and contacts 36, vias 38, and wires 40 arranged in the dielectric layers. The contacts 36, vias 38, and wires 40 are coupled with the device structure 10.

A moisture barrier layer 42 is formed at a top surface of the interconnect structure 34. The moisture barrier layer 42 is composed of a material that is permeable to hydrogen and that is impermeable to water molecules. This combination of material properties for the moisture barrier layer 42 permits free hydrogen to be released and escape from the device structure 10 and the interconnect structure 34, and also blocks the ingress of water molecules to provide the moisture barrier function. In an embodiment, the moisture barrier layer 42 may be composed of silicon oxynitride (SiON). In an embodiment, the silicon oxynitride constituting the moisture barrier layer 42 may have a lower density than the normal full density (3.17 grams per cubic centimeter ($g/cm^3$)) of silicon nitride.

Hydrogen in the device structure 10 and in the interconnect structure 34 may be mobile during, for example, MOL and BEOL processing when the device structure 10 and interconnect structure 34 are subjected to subsequent processes with a thermal budget. The ability to selectively release the mobile hydrogen by permeation through the moisture barrier layer 42 may reduce the availability of free hydrogen to deactivate dopant at the drain side (i.e., doped lateral extension region 20 at the drain side) of the device structure 10 by hot carrier effects in an operating device structure.

Example 1

Figure 5:
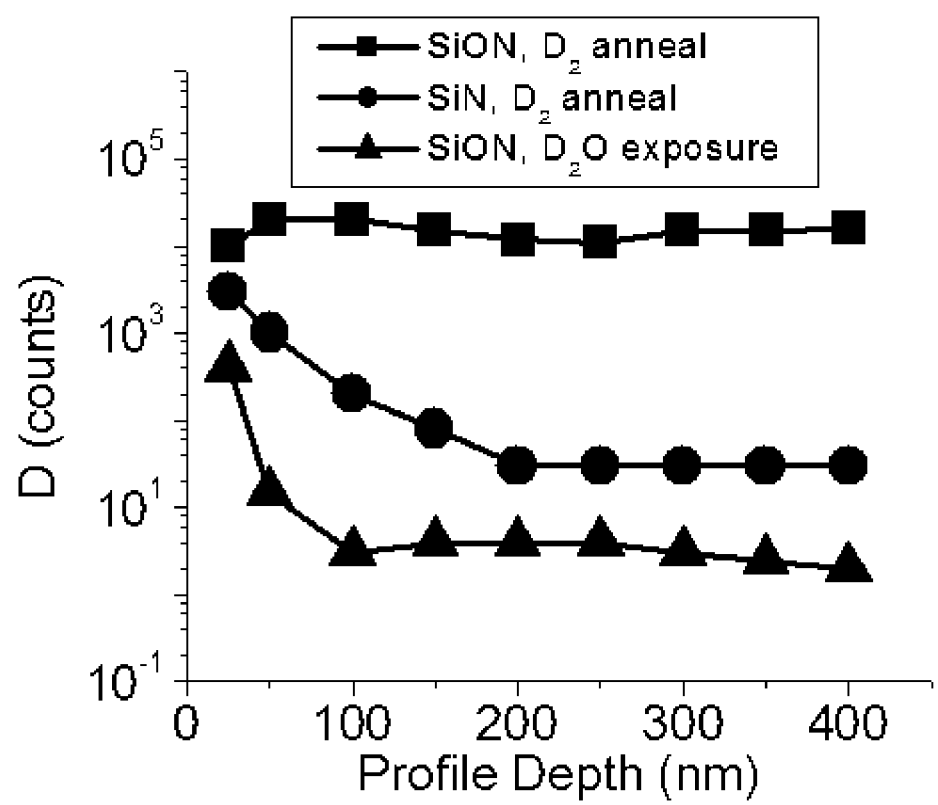
FIG. 5 is a plot containing data illustrating the hydrogen permeation and water vapor permeation of moisture barriers composed of silicon nitride and silicon oxynitride.

The diffusion of hydrogen through films of silicon nitride and silicon oxynitride was experimentally investigated. A film of each of these materials was deposited with a thickness greater than 400 nanometers. Both films were exposed to an anneal at 400° C. for one hour in a deuterium ($D_2$) gas environment, which drives deuterium into the films. The deuterated films were analyzed by secondary ion mass spectrometry (SIMS) to study the depth profile of deuterium, as presented in FIG. 5. A number of counts for deuterium ions collected in the SIMS profile is related to the concentration of deuterium.

For the SIMS profile of the deuterated silicon oxynitride film, deuterium was observed over a depth range from the surface to 400 nm at a roughly constant level of approximately $10^4$ ion counts. By comparison, deuterium in the SIMS profile of the deuterated silicon nitride film drops from $3 \times 10^3$ ion counts at the surface to approximately 30 ion counts at a depth of 200 nm. The reduced permeation of deuterium into silicon nitride indicates that the barrier properties of silicon oxynitride to the transport of any isotope of hydrogen are lower than the barrier properties of silicon nitride to the transport of any isotope of hydrogen. In other words, hydrogen has a higher diffusion rate in silicon oxynitride than in silicon nitride, which may be linked with improvements in hydrogen release from silicon oxynitride in comparison with silicon nitride.

Example 2

The diffusion of moisture through the silicon oxynitride film was also experimentally investigated. A silicon oxynitride film was heated to a temperature of 85° C. for 24 hours in a deuterated water ($D_2O$) vapor environment. Following the anneal, the deuterated film was analyzed by SIMS to study the depth profile of deuterium, as presented in FIG. 5. Deuterium was observed to rapidly decrease in the SIMS profile from $2 \times 10^2$ ion counts at the surface of the silicon oxynitride film to about 3-4 ion counts at a depth of about 100 nm. This rapid decrease in ion counts indicates that the silicon oxynitride film exhibits good moisture barrier properties by limiting the permeation of water.

Example 3

A capping layer composed of silicon nitride was prepared by a process in which the silicon nitride was UV cure silicon nitride and was cured using ultraviolet radiation. For comparison, a capping layer also composed of silicon nitride was prepared by a prior art process in which the silicon nitride was not ultraviolet-curable. The hydrogen content of the capping layers was measured by Fourier Transform Infrared (FTIR) spectroscopy and is shown in the Table.

TABLE

| FTIR Measurement | $NH + NH_2$ Bond | SiH Bond | SiN Bond | $(NH + NH_2)$ Bond/SiH Bond | SiH Bond/SiN Bond |
|---|---|---|---|---|---|
| Prior Art SiN | 9.71 | 3.91 | 254.4 | $3.82 \times 10^{-2}$ | $15.4 \times 10^{-3}$ |
| UV Cure SiN | 8.90 | 1.81 | 236.6 | $3.76 \times 10^{-2}$ | $7.65 \times 10^{-3}$ |

The prior art SiN capping layer has higher ratio of ($NH+NH_2$) bond to SiN bond and a higher ratio of SiH bond to SiN bond compared with the UV Cure SiN capping layer. The lower SiH bond and $NH+NH_2$ bond in the UV cure SiN film indicates a reduction in free hydrogen near the gate region, which in turn allows less hydrogen to be released into the extension region during hot carrier stress.

Example 4

Field-effect transistors were fabricated consistent with the embodiments of the invention and were subjected to a reliability stress test in which the source was grounded, the gate was biased at 1.55 volts, and the drain was biased at 3.1 volts. Device attributes, such output current and threshold voltage, were periodically measured. Device degradation over a period of 10 years was extrapolated from the respective plots of output current versus time acquired over 10,000 seconds of hot carrier stress.

A field-effect transistor fabricating using a capping layer composed of UV Cure SiN exhibited a 6% improvement in drive current degradation over 10 years of projected use. A field-effect transistor fabricated with a moisture barrier layer composed of silicon oxynitride exhibited an 11% improvement in drive current degradation over 10 years of projected use. A field-effect transistor fabricated with sidewall spacers formed of silicon nitride deposited by RTCVD with a lengthened 100 second preheat at a predetermined process temperature of 750° C. exhibited a 7% improvement in drive current degradation over 10 years of projected use. When accumulated, the three different process modifications yield a 24% reduction of drive current degradation from hot carrier stress over 10 years of projected use, which permitted the 10 year projection for drive current degradation due to hot carrier stress to reach less than 5%. In contrast, a reliability stress test of a conventional field-effect transistor (i.e., with a conventional capping layer, a conventional moisture barrier, and sidewall spacers formed from conventional silicon nitride) yielded a 10 year projection for drive current degradation due to hot carrier stress of 29%.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" direction. Terms such as "over", "above", "beneath", and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
forming a gate structure of a field-effect transistor on a substrate;
heating the substrate inside a deposition chamber to a given process temperature for a hold time period of greater than or equal to 100 seconds;
after the hold time period concludes, depositing a conformal layer of silicon nitride at the given process temperature over the gate structure;
etching the conformal layer of silicon nitride to form a plurality of sidewall spacers on the gate structure;
after the sidewall spacers are formed, depositing a first capping layer conformally over the gate structure and the sidewall spacers; and
curing the first capping layer with a first ultraviolet light treatment,
wherein the given process temperature is held constant during the hold time period, and the given process temperature is held constant during the deposition of the conformal layer of silicon nitride.

2. The method of claim 1 further comprising:
implanting phosphorous to form a lateral drain extension in the substrate.

3. The method of claim 1 further comprising:
forming an interconnect structure over the field-effect transistor; and
forming a moisture barrier layer over the interconnect structure,
wherein the moisture barrier layer is comprised of a material that is permeable to hydrogen and that is impermeable to water molecules.

4. The method of claim 3 wherein the material is silicon oxynitride.

5. The method of claim 4 wherein the silicon oxynitride has a density less than 3.17 grams per cubic centimeter.

6. The method of claim 1 further comprising:
depositing a second capping layer conformally over the first capping layer; and
curing the second capping layer with a second ultraviolet light treatment.

7. The method of claim 1 wherein the hold time period is in a range of 100 seconds to 300 seconds.

8. The method of claim 1 wherein the given process temperature is 750° C.

9. The method of claim 1 wherein the field-effect transistor is a long channel device having a gate length between 120 nanometers and 300 nanometers.

10. A method comprising:
forming a gate structure of a field-effect transistor on a substrate;
heating the substrate inside a deposition chamber to a given process temperature for a hold time period of greater than or equal to 100 seconds;
after the hold time period concludes, depositing a conformal layer of silicon nitride at the given process temperature over the gate structure;
etching the conformal layer of silicon nitride to form a plurality of sidewall spacers on the gate structure;
forming an interconnect structure over the field-effect transistor; and
forming a moisture barrier layer over the interconnect structure,
wherein the moisture barrier layer is comprised of a material that is permeable to hydrogen and that is impermeable to water molecules, the given process temperature is held constant during the hold time period, and the given process temperature is held constant during the deposition of the conformal layer of silicon nitride.

11. The method of claim 10 further comprising:
implanting phosphorous to form a lateral drain extension in the substrate.

12. The method of claim 10 wherein the material is silicon oxynitride.

13. The method of claim 12 wherein the silicon oxynitride has a density less than 3.17 grams per cubic centimeter.

14. The method of claim 10 wherein the hold time period is in a range of 100 seconds to 300 seconds.

15. The method of claim 10 wherein the given process temperature is 750° C.

16. The method of claim 10 wherein the field-effect transistor is a long channel device having a gate length between 120 nanometers and 300 nanometers.

* * * * *